(12) United States Patent
Grave et al.

(10) Patent No.: US 11,284,489 B2
(45) Date of Patent: Mar. 22, 2022

(54) LED LIGHTING PACKAGE

(71) Applicant: Lumileds LLC, San Jose, CA (US)

(72) Inventors: Manuel Grave, Aachen (DE); Udo Karbowski, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/951,990

(22) Filed: Nov. 18, 2020

(65) Prior Publication Data

US 2021/0153322 A1 May 20, 2021

(30) Foreign Application Priority Data

Nov. 18, 2019 (EP) .................................. 19209716

(51) Int. Cl.
| | |
|---|---|
| *H05B 45/395* | (2020.01) |
| *H05B 45/20* | (2020.01) |
| *H05B 45/46* | (2020.01) |
| *H01L 25/075* | (2006.01) |
| *H01L 25/16* | (2006.01) |
| *H01L 33/62* | (2010.01) |

(52) U.S. Cl.
CPC ....... *H05B 45/395* (2020.01); *H01L 25/0753* (2013.01); *H01L 25/167* (2013.01); *H01L 33/62* (2013.01); *H05B 45/20* (2020.01); *H05B 45/46* (2020.01); *H01L 2933/0066* (2013.01)

(58) Field of Classification Search
None
See application file for complete search history.

(56) References Cited

U.S. PATENT DOCUMENTS

| | | | |
|---|---|---|---|
| 2008/0259252 A1* | 10/2008 | Tanaka | G02F 1/133621 349/69 |
| 2008/0309255 A1* | 12/2008 | Myers | F21K 9/62 315/297 |
| 2012/0223648 A1 | 9/2012 | Jin et al. | |
| 2014/0268771 A1* | 9/2014 | Heikman | F21V 29/506 362/249.02 |

(Continued)

OTHER PUBLICATIONS

"Chinese Application Serial No. 202011293791.3, Office Action dated Dec. 9, 2020", (w/ English Translation), 2 pgs.

(Continued)

*Primary Examiner* — Crystal L Hammond
(74) *Attorney, Agent, or Firm* — Schwegman Lundberg & Woessner, P.A.

(57) ABSTRACT

An LED lighting package is described that contains a first LED string with a plurality of series-connected light-emitting diodes and a first linear regulator arranged to determine the current through the first LED string. At least one further LED string includes a plurality of series-connected light-emitting diodes of a different color, and a further linear regulator is arranged to determine the current through that LED string. The different colored LED strings are connected in parallel. A common voltage supply is used for the LED strings. The number of light-emitting diodes in the first LED string exceeds the number of light-emitting diodes in each further LED string (, and the number of light-emitting diodes in each LED string is chosen such that the total forward voltage of a further LED string is essentially the same as the total forward voltage of the first LED string.

20 Claims, 3 Drawing Sheets

(56) References Cited

U.S. PATENT DOCUMENTS

2014/0306540 A1* 10/2014 Wu .................. H02J 3/385
　　　　　　　　　　　　　　　　　　　　　307/77
2014/0361697 A1* 12/2014 Miskin .............. H05B 45/20
　　　　　　　　　　　　　　　　　　　　　315/192

OTHER PUBLICATIONS

"Chinese Application Serial No. 202011293791.3, Response filed Jan. 18, 2021 to Office Action dated Dec. 9, 2020", (w/ English Translation), 6 pgs.
"European Application Serial No. 19209716.0, Extended European Search Report dated May 14, 2020", 9 pgs.
"European Application Serial No. 19209716.0, Response filed Oct. 22, 2021 to Extended European Search Report dated May 14, 2020", 33 pgs.

* cited by examiner

LED LIGHTING PACKAGE

PRIORITY

This application claims the benefit of priority to EP Patent Application Serial No. 19209716.0, filed Dec. 24, 2019, which is incorporated herein by reference in its entirety.

TECHNICAL FIELD

An LED lighting package, an LED lighting unit, and a method of manufacturing an LED lighting package are described herein.

BACKGROUND

It is known to realize multi-color LED packages by arranging red, green and blue LEDs in parallel. The light-emitting diodes used in such an RGB package are usually direct-emitting LEDs, i.e. non-encapsulated dies, and an additional white light-emitting diode used in an RGBW package is generally phosphor converted. By using an appropriate driver architecture, the color of the light that is output by the package can be controlled as desired. For example, a single package may comprise a red LED, a green LED and a blue LED. The driver controls the current through the LEDs to "mix" the desired color. Multiple such RGB or RGBW LED packages can be arranged in series on a flexible strip, in the form of two-dimensional matrix, or in various other ways, and can be programmed as desired so that each package acts as a pixel of a display module, a lighting unit, etc.

A low-power LED package may use linear current regulation for current limiting, for example with a linear regulator connected in line with each LED. A common supply voltage can provide power to the LEDs. However, LEDs that emit at different colors generally have different forward voltages. For example, the forward voltage of a direct-emitting red LED is less than the forward voltage of a comparable green, blue or white LED A red LED has a typical forward voltage of about 2 V, but a comparable green, blue, or white LED has a typical forward voltage of about 3 V. The voltage difference of 1 V needs to be compensated by the linear regulator of the red LED, which amounts to power dissipation by the linear regulator. This power dissipation is effectively the conversion of superfluous energy into heat, meaning that the prior art approach is inefficient in combination with a linear regulator. The type of linear regulator driver generally used with a multi-color LED package will comprise several instances of the same linear regulator, and as long as the linear regulators are used to dissipate superfluous energy, an integrated package based on this design is constrained to low-power LEDs, which draw low currents. Mid- to high-power LEDs draw higher currents, but higher currents result in correspondingly higher losses, so that a (relatively cheap) linear regulator driver is not suitable for a circuit comprising high power LEDs with different forward voltages.

There are many applications that would benefit from the ability to combine different-colored mid-power LEDs or high-power LEDs. One approach may be to use one DC-DC converter per LED in order to minimize losses. However, this presents problems if the driver is to be incorporated in a common package together with the LEDs, since a DC-DC converter and other required components take up too much space. To avoid the problems associated with linear regulators when the LEDs have different forward voltages, the known approach is to arrange multiple separate DC-DC converters one for each LED outside the LED package. However, such realizations are comparatively large and cannot be used in space-constrained applications.

Therefore, it is an object to provide a way of combining LEDs of different colors into a common package to overcome the problems outlined above.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
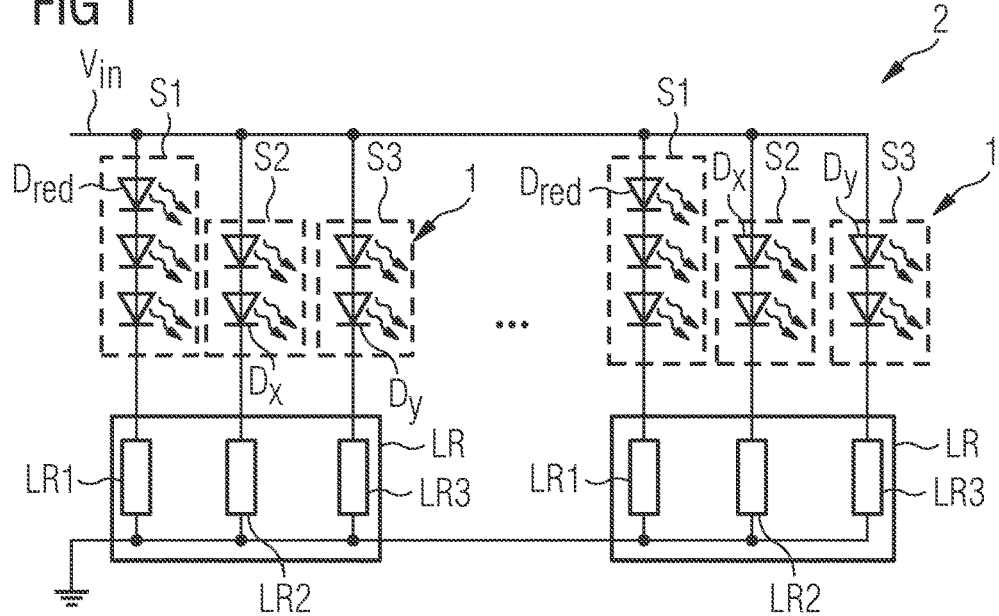
FIG. 1 shows a circuit diagram illustrating an embodiment of the LED lighting package 1.

In some embodiments, the LED lighting package comprises a first LED string comprising a plurality of series-connected light-emitting diodes, and a first linear regulator arranged to determine the current through the first LED string; at least one further LED string comprising a plurality of series-connected light-emitting diodes of a different color, and a further linear regulator arranged to determine the current through that LED string; wherein the different colored LED strings are connected in parallel; and a common voltage supply for the LED strings. The forward voltage of an LED of a further LED string is greater than the forward voltage of an LED of the first LED string. The LED lighting package is characterized in that the number of light-emitting diodes in the first LED string exceeds the number of light-emitting diodes in each further LED string, and the number of light-emitting diodes in each LED string is chosen such that the total forward voltage of a further LED string is essentially the same as the total forward voltage of the first LED string.

By matching the forward voltages of the LED strings in such an LED package, it is possible to minimize or even eliminate the excess power dissipation in the linear regulators. The voltage difference to be compensated by the linear regulator of the "red" LED string is much lower than in a comparable lighting package, and can be 0.1 V or even less. An advantage of the LED lighting package is that the number of LEDs in the strings can be increased without running the risk of undesirable temperatures developing in a linear regulator.

A lighting unit may comprise a number of such LED lighting packages, and is realized for any of an automotive lighting application, a decorative lighting application, a video wall application, etc.

A method of manufacturing an LED lighting package comprises providing a first LED string with a plurality of series-connected light-emitting diodes; providing at least one further LED string with a plurality of series-connected light-emitting diodes of a different color, wherein the forward voltage of an LED of a further LED string is greater than the forward voltage of an LED of the first LED string. The number of light-emitting diodes in each LED string is chosen such that each LED string has essentially the same total forward voltage; connecting the different colored LED strings in parallel; providing a common voltage supply for the LED strings; and connecting a linear regulator to each LED string.

The linear regulator may be used to control the current through the associated LED string so that the string emits light at the desired level of brightness. In the following, it may be assumed that a linear regulator is realized as a low-dropout regulator (LDO). It may also be assumed that the linear regulators are identical. The linear regulators may be provided in the form of an integrated circuit package with input and output pins. Each input pin of a "low-side" linear regulator can be connected to the cathode of an LED string, while the output pins may be collectively connected to the return supply line or to ground. Alternatively, a "high-side" linear regulator may be used, in which case the input pin of the regulator is connected to the supply line, its output pin is connected to the anode of the LED string, and the cathode of the LED string is connected to ground.

The first LED string can comprise red-emitting LEDs, which generally have a low forward voltage in the range 1.6 V-2.2 V. Alternatively, the first LED string may comprise infrared-emitting LEDs, which generally have an even lower forward voltage of about 1.2-1.8 V. In the following it may be assumed that the first LED string comprises red-emitting LEDs, although other color LEDs may be used.

In one embodiment, the LED lighting package comprises two LED strings. In this case, the first LED string comprises red light-emitting diodes, and the second LED string comprises amber light-emitting diodes.

In another embodiment, the LED package comprises three LED strings. In this case, the first LED string comprises red light-emitting diodes, the second LED string comprises green light-emitting diodes, and the third LED string comprises blue light-emitting diodes.

In another embodiment, the LED package comprises four LED strings. In this case, the first LED string comprises red light-emitting diodes, the second LED string comprises green light-emitting diodes, the third LED string comprises blue light-emitting diodes, and the fourth LED string comprises blue light-emitting diodes with white phosphor.

If the forward voltage of a red light-emitting diode of the first LED string is denoted as $V_{f\_lo}$, and the number of LEDs in the "red" string is denoted by m, and if the forward voltage of a light-emitting diode of a further LED string is denoted as $V_{f\_other}$ and the number of LEDs in this "further" string is denoted by n, the forward voltages of the strings are preferably matched by choosing m and n such that $m \cdot V_{f\_red}$ is essentially equal to $n \cdot V_{f\_other}$. Here, the terms are essentially equal if they differ by only a negligible amount, e.g. by at most a few percent.

In another embodiment, the first LED string comprises three red light-emitting diodes, each with a forward voltage of 2 V so that the total forward voltage of the "red" string is 6 V. In this embodiment, any further LED string comprises two light-emitting diodes, each with a forward voltage of 3 V, so that the total forward voltage of a "further" string is also 6 V.

In another embodiment, the first LED string comprises six red light-emitting diodes, each with a forward voltage of 2 V, so that the total forward voltage of the "red" string is 12 V. In this embodiment, any further LED string comprises four light-emitting diodes, each with a forward voltage of 3 V, so that the total forward voltage of a "further" string is also 12 V.

While low-power LEDs are common and are to be found in widespread applications, high-power LEDs are generally restricted to use in specific applications on account of the problems arising from the heat generated by power dissipation. Earlier approaches of using equal-length LED strings are characterized by a certain degree of inefficiency, since the regulator of the red LED string must dissipate more power than a linear regulator of any other color string. In the case of very small package size, the power dissipation may lead to undesirable heating, which in turn may lead to a reduced light output. The power dissipation is also a problem in applications that have a tight power supply budget or a finite power supply, for example any application that is powered from a battery. These problems are overcome since the matched forward voltages mean that the regulators may dissipate essentially the same amount of power. For these and other reasons, the embodiments described are well suited to applications limited to small light sources that have a very high light output or luminous flux. In another embodiment, therefore, each LED of an LED string has a rated power in the order of 50 mW to 100 mW. Such LEDs are referred to as mid-power LEDs. In a further embodiment, each LED of an LED string has a rated power in the order of 500 mW to 1 W. Such LEDs are referred to as high-power LEDs.

The LED lighting package can be realized in any suitable manner. For example, in a one embodiment, an LED string comprises individual dies connected in series by bonding wires. Alternatively, an LED string might comprise individual dies connected in series using a conductive glue or solder on a carrier such as a lead frame or an interposer.

An LED of the LED lighting package can be realized as a single-junction die. Alternatively, the LED lighting package can comprise multi-junction dies, or a combination of single-junction dies and multi-junction dies.

One embodiment of the lighting unit is realized for an automotive lighting application with rear position light and amber signaling light functions. The rear position light function is fulfilled by the red LED string of an LED lighting package. In this embodiment, the LED lighting package only needs two LED strings, and the second LED string comprises amber light-emitting diodes. The lighting unit can comprise one or more of these LED lighting packages.

Referring to the figures, FIG. 1 shows a first embodiment using the LED lighting package 1. Mere, multiple instances of the LED lighting package 1 are connected in an LED lighting unit 2 for a compact application such as backlighting in an automobile interior. Each LED lighting package 1 comprises a first LED string S1 comprising three series-connected red light-emitting diodes $D_{red}$, and a first linear regulator LR1 arranged to determine the current through the first LED string S1. Each LED lighting package 1 includes two further LED strings S2, S3, each comprising two series-connected light-emitting diodes Dx, Dy of a different color, as well as two linear regulators LR2, LR3 to control the current through these LED strings S2, S3. The linear regulators L1, L2, L3 may be assumed to be identical. A "further" LED string S2, S3 may be assumed to comprise two identical LEDs of any color other than red. The different colored LED strings S1, S2, S3 are connected in parallel and are connected to a common voltage supply $V_{in}$. The outputs of the linear regulators LR1, LR2, LR3 are connected to ground. In each LED lighting package 1, the number of light-emitting diodes in each LED string S1, S2, S3 is chosen such that the total forward voltage of a further LED string S2, S3 is essentially the same as the total forward voltage of the first LED string S1. For any string, the total forward voltage is the sum of the forward voltages of the LEDs in that string. The total forward voltage of the first LED string S1 is therefore three times the forward voltage of a red LED $D_{red}$, while the total forward voltage of a further LED string S2, S3 is two times the forward voltage of LED used in that string.

Figure 2:
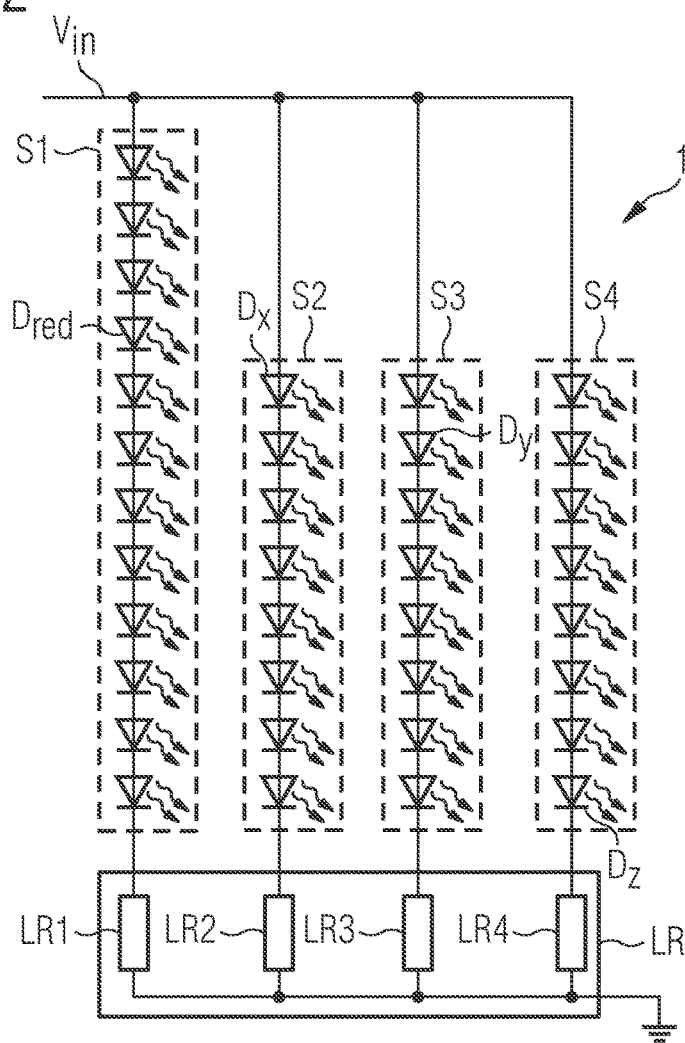
FIG. 2 shows a circuit diagram illustrating a further embodiment of the LED lighting package 1.

FIG. 2 shows a further embodiment of the LED lighting package 1. In this case also, the LED lighting package 1 comprises a first LED string S1 of red LEDs $D_{red}$, in this case 12 red LEDs $D_{red}$. A first linear regulator LR1 determines the current through the first LED string S1. The LED lighting package 1 includes further LED strings S2, S3, S4, each comprising eight series-connected light-emitting diodes Dx, Dy, Dz of a different color, as well as linear regulators LR2, LR3, LR4 to control the current through these LED strings S2, S3, S4. The linear regulators L1-L4 may be assumed to be identical. A "further" LED string S2, S3, S4 may be assumed to comprise eight identical LEDs Dx, Dy, Dz of any color other than red. The different colored LED strings S1, S2, S3, S4 are connected in parallel and are connected to a common voltage supply $V_{in}$. The outputs of the linear regulators LR1-LR4 are connected to ground. In the LED lighting package 1, the number of light-emitting diodes in each LED string S1, S2, S, S4 is chosen such that the total forward voltage is essentially the same for each string S1, S2, S3, S4. In this embodiment, strings S2, S3, S4 may be assumed to comprise green, blue and white LEDs respectively, so that $$12 \cdot V_{f\_lo} = 8 \cdot V_{f\_green} = 8 \cdot V_{f\_blue} = 8 \cdot V_{f\_white}$$

Figure 3:
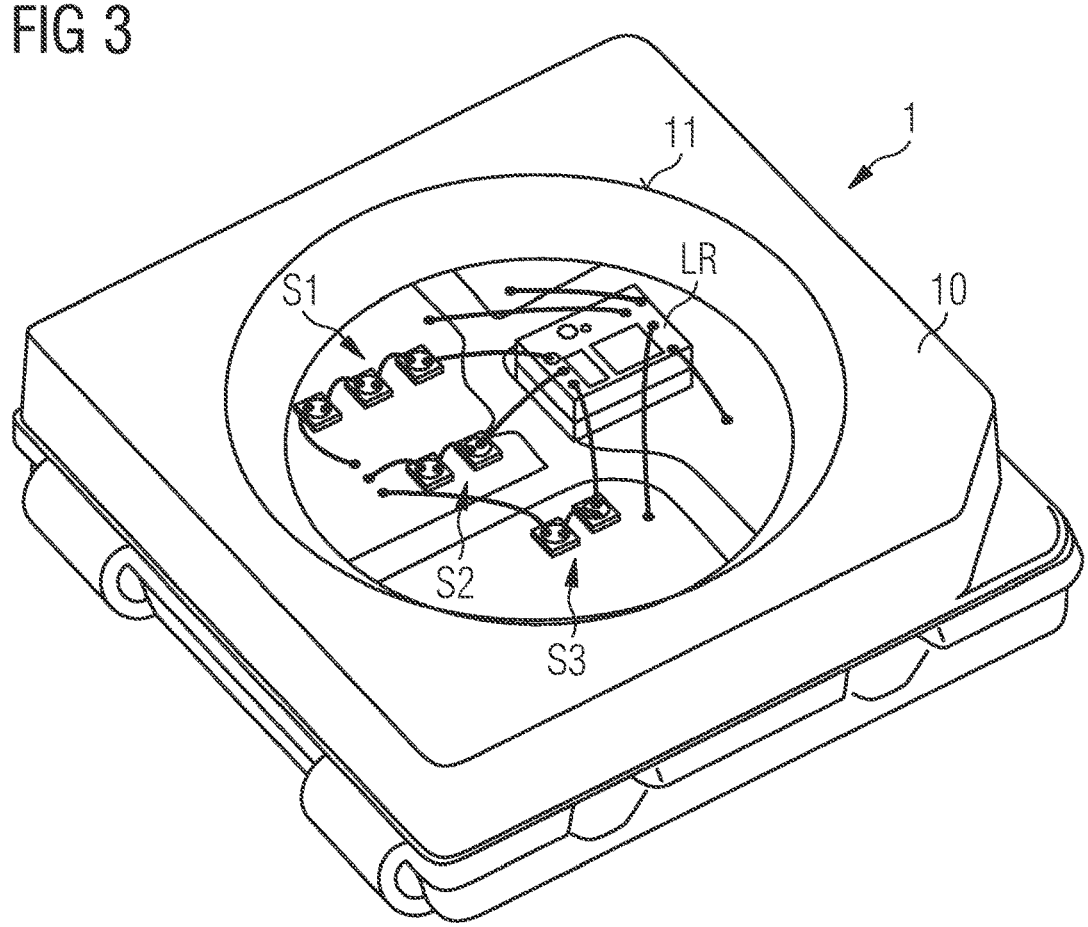
FIG. 3 shows an exemplary LED lighting package.

FIG. 3 shows an exemplary LED package, with three LED strings S1, S2, S3 connected to a linear regulator module LR in the form of an IC package. In this embodiment, an LED string S1, S2, S3 comprises individual dies connected in series using wirebonds. The entire circuit is enclosed in a housing 10 and encapsulated by an epoxy dome 11. This type of package may be manufactured as a plastic leaded chip carrier (PLCC) with four leads, i.e. a PLCC-4 package.

Figure 4:
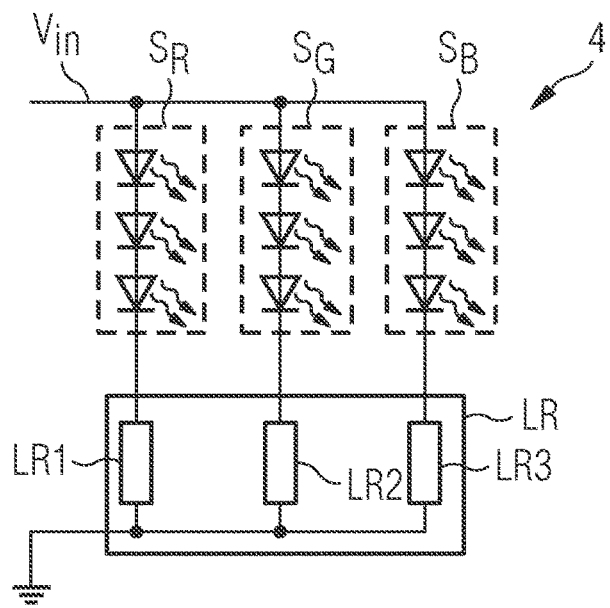
FIG. 4 shows a prior art LED lighting package.

FIG. 4 shows a simplified circuit diagram of a LED lighting package 4 based on the conventional approach of using equal-length strings. Here, the package 4 comprises three strings $S_R$, $S_G$, $S_B$, each with the same number of identical LEDs, so that the "red" string comprises three red LEDs, the "green" string Sc, comprises three green LEDs, and the "blue" string $S_B$ comprises three blue LEDs. The problem with this lighting circuit, is that the total forward voltage of the "red" string is less than the total forward voltage of either of the other two strings $S_G$, $S_B$, which means that the linear regulator LR1 of the "red" string must dissipate power arising from the difference in forward voltages. Such a circuit is inefficient because of this waste of energy. Furthermore, the circuit is limited to low-power LEDs, since this type of linear regulator is not suited to the dissipation of power arising from mid- to high-power LEDs that draw higher currents.

The power that must be dissipated by a linear regulator is directly related to the LED current. The maximum allowable power dissipation is subject to constraints such as PCB type, PCB layout, heatsink size, ambient temperature, etc. Therefore, if power in the range of 100 mW must be dissipated, this may already exceed the rated capacity of a driver when packaged in a PLCC-4 described in FIG. 3. For these reasons, in order to reduce costs, a prior art LED package generally only has one LED per color. Instead of the three strings $S_R$, $S_G$, $S_B$ of FIG. 4, the circuit would only comprise a single red LED, a single green LED, and a single blue LED.

Figure 5:
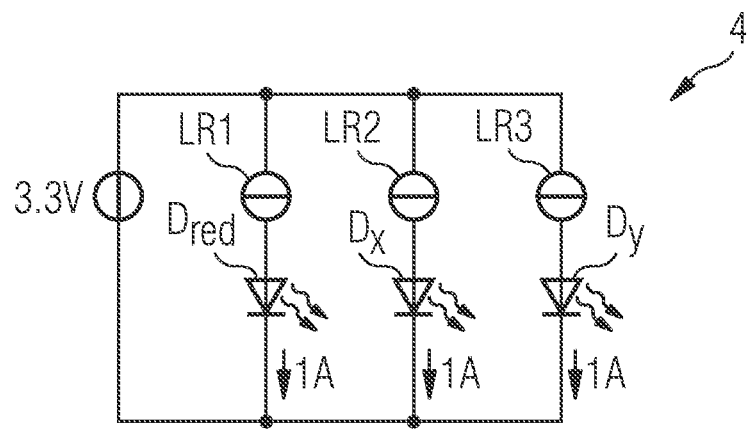
FIG. 5 and FIG. 6 illustrate the difference between a prior art LED lighting package and the LED lighting package.
Figure 6:
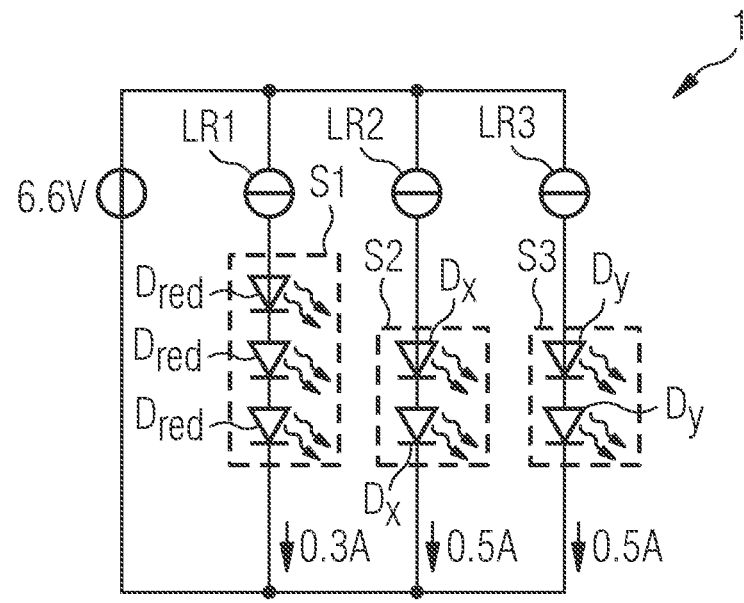

FIG. 5 and FIG. 6 illustrate the difference between a prior art LED lighting package 4 (shown in FIG. 5) and the LED lighting package 1 (shown in FIG. 6). In FIG. 5, three different color LEDs $D_{red}$, $D_x$, $D_y$ are powered by a 3.3 V power supply. The LEDs $D_{red}$, $D_x$, $D_y$ each draw 1 A of current. The forward voltage of the red LED $D_{red}$ is 2 V, while the forward voltage of each of the other two LEDs $D_x$, $D_y$ is 3 V. The thermal loss $P_{losss\_red}$ of the linear regulator LR1 for the red LED $D_{red}$ is:

$$P_{loss_{red}} = (3.3\ V - 2\ V) \cdot 1\ A = 1.3\ W$$

The thermal loss $P_{loss\_other}$ of the linear regulator LR2, LR3 for the other color LED $D_x$, $D_y$ is:

$$P_{loss_{other}} = (3.3\ V - 3\ V) \cdot 1\ A = 0.3\ W$$

In FIG. 6, three strings S1, S2, S3 of different color LEDs $D_{red}$, $D_x$, $D_y$ are powered by a 6.6 V power supply. The "red" string comprises 3 red. LEDs $D_{red}$, whereas the other strings (e.g. a "blue" string and a "green" string) each comprises only two LEDs $D_x$, $D_y$. The "red" string draws 0.3 A of current, whereas the other two strings S2, S3 each draw 0.5 A of current. The forward voltage of a red LED $D_{red}$ is 2 V, while the forward voltage of each of the other two types of LED $D_x$, $D_y$ is 3 V. In this case, the thermal $P_{loss\_red}$ of the linear regulator LR1 for the "red" string S1 is:

$$P_{loss_{red}} = (6.6\ V - 3 \cdot 2\ V) \cdot 0.3\ A = 0.2\ W$$

The thermal loss $P_{loss\_other}$ of the linear regulator LR2, LR3 for each of the other strings S2, S3 is:

$$P_{loss_{other}} = (6.6\ V - 3 \cdot 3\ V) \cdot 0.5\ A = 0.3\ W$$

The thermal loss associated with the red LED in the prior art LED lighting package shown in FIG. 5 is more than four times higher than the thermal loss associated with the red LED string in the inventive LED lighting package shown in FIG. 6. This is because of the greater efficiency of the "red" channel in the circuit of FIG. 6. An advantage of the inventive circuit is the allowable headroom, i.e. it is possible to increase the current through the red LEDs to compensate for flux decrease associated with increased junction temperature during operation of the LED lighting package.

Although certain embodiments and variations thereon are described herein, it will be understood that numerous additional modifications and variations could be made thereto without departing from the scope of the disclosure. It is to be understood that the drawings are designed solely for the purposes of illustration and not as a definition of the limits of the disclosure.

For the sake of clarity, it is to be understood that the use of "a" or "an" throughout this application does not exclude a plurality, and "comprising" does not exclude other steps or elements.

What is claimed is:

1. A light emitting diode (LED) lighting package comprising:
   a first LED string comprising a plurality of series-connected light-emitting diodes having a first color;
   a first linear current regulator arranged to determine a current through the first LED string, the current through the first LED string configured to compensate for a flux decrease associated with increased junction temperature during operation of the LED lighting package;
   a second LED string comprising a plurality of series-connected light-emitting diodes of a second color different from the first color, the first LED string coupled in parallel with the second LED string, a number of LEDs in the first LED string exceeding a number of LEDs in the second LED string, and the number of LEDs in each of the first LED string and the second LED string chosen such that a total forward voltage of the second LED string is essentially the same as a total forward voltage of the first LED string;

a second linear current regulator arranged to determine a current through the second LED string; and a common voltage supply for the first LED string and the second LED string.

2. The LED lighting package according to claim 1, wherein:
a forward voltage of a light-emitting diode of the first LED string is $V_{f\_lo}$,
a forward voltage of a LED of the second LED string is $V_{f\_other}$, and
a number LEDs in the first LED string and the second LED string is chosen such that $m \cdot Vf_{f\_lo} = n \cdot Vf_{f\_other}$.

3. The LED lighting package according to claim 1, wherein:
the first LED string comprises red LEDs, and
the second LED string comprises amber LEDs.

4. The LED lighting package according to claim 1, further comprising a third LED string, the first LED string comprising red LEDs, the second LED string comprising green LEDs, and the third LED string comprising blue LEDs.

5. The LED lighting package according to claim 1, further comprising a third LED string and a fourth LED string, the first LED string comprising red LEDs, the second LED string comprising green LEDs, the third LED string comprising blue LEDs, and the fourth LED string comprising white LEDs.

6. The LED lighting package according to claim 1, wherein:
the first LED string comprises three red LEDs, each with a forward voltage of 2 V, and
the second LED string comprises two LEDs, each with a forward voltage of 3 V.

7. The LED lighting package according to claim 1, wherein:
the first LED string comprises six red LEDs, each with a forward voltage of 2 V, and
the second LED string comprises four LEDs, each with a forward voltage of 3 V.

8. The LED lighting package according to claim 1, wherein each LED of each of the first LED string and the second LED string has a rated power of at least 50 mW.

9. The LED lighting package according to claim 1, wherein each LED of each of the first LED string and the second LED string has a rated power of at least 500 mW.

10. The LED lighting package according to claim 1, wherein each of the first LED string and the second LED string comprises individual dies connected in series by bonding wires.

11. The LED lighting package according to claim 1, wherein each of the first LED string and the second LED string comprises individual dies connected in series on a carrier.

12. The LED lighting package according to claim 1, wherein LEDs of at least one of the first LED string or the second LED string a multi-junction die.

13. The LED lighting package according to claim 1, wherein at least one of the first linear current regulator or the second linear current regulator is a low-dropout regulator.

14. The LED lighting package according to claim 13, wherein:

at least one of the first linear current regulator or the second linear current regulator is an integrated circuit package with input and output pins, each input pin of a low-side of the at least one of the first linear current regulator or the second linear current regulator is connected to a cathode of an associated one of the first LED string or the second LED string, and output pins of the at least one of the first linear current regulator or the second linear current regulator are collectively connected to a return supply line or to ground.

15. The LED lighting package according to claim 13, wherein:

at least one of the first linear current regulator or the second linear current regulator is an integrated circuit package with input and output pins, an input pin of a high-side of the at least one of the first linear current regulator or the second linear current regulator is connected to a return supply line, an output pin of the at least one of the first linear current regulator or the second linear current regulator is connected an anode of an associated one of the first LED string or the second LED string, and a cathode of the associated one of the first LED string or the second LED string is connected to ground.

16. The LED lighting package according to claim 1, wherein the current through the first LED string and the second LED string is configured such that a thermal loss of the first linear current regulator is smaller than a thermal loss of the second linear current regulator.

17. A light emitting diode (LED) lighting unit comprising:
a plurality of LED packages, each LED package comprising:
a first LED string comprising a plurality of series-connected light-emitting diodes having a first color;
a first linear current regulator arranged to determine a current through the first LED string, the current through the first LED string configured to compensate for a flux decrease associated with increased junction temperature during operation of the LED lighting package;
a second LED string comprising a plurality of series-connected light-emitting diodes of a second color different from the first color, the first LED string coupled in parallel with the second LED string, a number of LEDs in the first LED string exceeding a number of LEDs in the second LED string, and the number of LEDs in each of the first LED string and the second LED string chosen such that a total forward voltage of the second LED string is essentially the same as a total forward voltage of the first LED string;
a second linear current regulator arranged to determine a current through the second LED string; and
a common voltage supply for the first LED string and the second LED string.

18. The LED lighting unit according to claim 17, wherein the lighting unit is disposed in one of automotive lighting, decorative lighting or a video wall.

19. The LED lighting unit according to claim 17, wherein the lighting unit is disposed in automotive lighting and the second LED string comprises amber LEDs.

20. A method of manufacturing a light emitting diode (LED) lighting package, the method comprising:
providing a first LED string comprising a plurality of series-connected LEDs;

providing a second LED string comprising a plurality of series-connected LEDs of a different color than a color of the LEDs of the first LED string, a number of LEDs in the first LED string exceeding a number of LEDs in the second LED string, and the number of LEDs in each of the first LED string and the second LED string chosen such that each of the first LED string and the second LED string has essentially a same total forward voltage;

connecting the first LED string and the second LED string in parallel;

providing a common voltage supply for the first LED string and the second LED string;

connecting a linear current regulator to each of the first LED string and the second LED string; and increasing the current through the first LED string to compensate for a flux decrease associated with increased junction temperature during operation of the LED lighting package, the current through the first LED string further based on a thermal loss of the linear current regulator connected to the first LED string.

\* \* \* \* \*

UNITED STATES PATENT AND TRADEMARK OFFICE
CERTIFICATE OF CORRECTION

PATENT NO. : 11,284,489 B2
APPLICATION NO. : 16/951990
DATED : March 22, 2022
INVENTOR(S) : Grave et al.

It is certified that error appears in the above-identified patent and that said Letters Patent is hereby corrected as shown below:

In the Claims

Column 7, Line 62, Claim 12, delete "a" and insert --are a-- therefor

Signed and Sealed this
Seventeenth Day of May, 2022

Katherine Kelly Vidal
*Director of the United States Patent and Trademark Office*